US006861270B2

United States Patent
Sakai

(10) Patent No.: US 6,861,270 B2
(45) Date of Patent: Mar. 1, 2005

(54) METHOD FOR MANUFACTURING GALLIUM NITRIDE COMPOUND SEMICONDUCTOR AND LIGHT EMITTING ELEMENT

(75) Inventor: Shiro Sakai, 174-4 Nakatsu-ura, Hachiman-cho, Tokushima-shi, Tokushima 770-8072 (JP)

(73) Assignees: Shiro Sakai, Tokushima (JP); Nitride Semiconductors Co., Ltd., Naruto (JP)

( * ) Notice: Subject to any disclaimer, the term of this patent is extended or adjusted under 35 U.S.C. 154(b) by 0 days.

(21) Appl. No.: 10/092,231

(22) Filed: Mar. 6, 2002

(65) Prior Publication Data

US 2003/0094618 A1 May 22, 2003

(51) Int. Cl.[7] .......................... H01L 27/15; H01L 31/12
(52) U.S. Cl. .................... 438/22; 438/752; 257/103; 257/79; 257/613; 257/615
(58) Field of Search ................... 438/22, 752; 257/103, 257/79, 613, 615, 63, 76, 55, 190

(56) References Cited

U.S. PATENT DOCUMENTS

| | | | |
|---|---|---|---|
| 3,909,929 A | 10/1975 | Debesis | 29/590 |
| 4,985,113 A | 1/1991 | Fujimoto et al. | 156/643 |
| 5,332,697 A | 7/1994 | Smith et al. | 437/242 |
| 5,429,954 A | 7/1995 | Gerner | |
| 5,633,192 A | 5/1997 | Moustakas et al. | |
| 5,652,438 A | * 7/1997 | Sassa et al. | 257/94 |
| 5,717,226 A | * 2/1998 | Lee et al. | 257/86 |
| 5,767,581 A | * 6/1998 | Nakamura et al. | 257/749 |
| 5,786,233 A | 7/1998 | Taskar et al. | 438/46 |
| 5,787,104 A | 7/1998 | Kamiyama et al. | |

(List continued on next page.)

FOREIGN PATENT DOCUMENTS

| | | | |
|---|---|---|---|
| EP | 0 180 222 A2 | 5/1986 | H01L/31/18 |
| EP | 0 180 222 A3 | 5/1986 | H01L/21/308 |
| EP | 0 497 350 B2 | 8/1992 | C30B/25/02 |
| EP | 0 723 303 A2 | 7/1996 | H01L/33/00 |
| EP | 0 731 490 A2 | 9/1996 | H01L/21/033 |

(List continued on next page.)

OTHER PUBLICATIONS

English/Japanese Notice of Grounds For Rejection, Japanese Patent Application Ser. No. 2000–227963, 7 pages.
English/Japanese Notice of Grounds For Rejection, Japanese Patent Application Ser. No. 2000–164349, 4 pages.
Patent Abstract of Japanese Patent No. JP10312971, published Nov. 24, 1998, 1 page.
Patent Abstract of Japanese Patent No. JP2000021789, published Jan. 21, 2000, 1 page.
Patent Abstract of Japanese Patent No. JP11354839, published Dec. 24, 1999, 1 page.

(List continued on next page.)

Primary Examiner—Jerome Jackson
Assistant Examiner—Joseph Nguyen
(74) Attorney, Agent, or Firm—Osha & May L.L.P.

(57) ABSTRACT

A method for manufacturing a GaN compound semiconductor which can improve light emitting efficiency even when dislocations are present. An n type AlGaN layer, a undoped AlGaN layer, and a p type AlGaN layer are laminated on a substrate to obtain a double hetero structure. When the undoped AlGaN layer is formed, droplets of Ga or Al are formed on the n type AlGaN layer. The compositional ratio of Ga and Al in the undoped AlGaN layer varies due to the presence of the droplets, creating a spatial fluctuation in the band gap. Because of the spatial fluctuation in the band gap, the percentage of luminous recombinations of electrons and holes is increased.

13 Claims, 4 Drawing Sheets

U.S. PATENT DOCUMENTS

| | | | |
|---|---|---|---|
| 5,804,918 A * | 9/1998 | Yazawa et al. | 313/506 |
| 5,874,747 A | 2/1999 | Redwing et al. | 257/77 |
| 5,880,485 A | 3/1999 | Marx et al. | |
| 5,888,886 A | 3/1999 | Sverdlov et al. | 438/505 |
| 5,900,650 A | 5/1999 | Nitta | 257/94 |
| 5,929,466 A | 7/1999 | Ohba et al. | 257/103 |
| 6,030,848 A | 2/2000 | Yuge et al. | 438/46 |
| 6,046,464 A * | 4/2000 | Schetzina | 257/96 |
| 6,090,666 A | 7/2000 | Ueda et al. | 438/257 |
| 6,103,604 A | 8/2000 | Bruno et al. | 438/584 |
| 6,172,382 B1 | 1/2001 | Nagahama et al. | 257/94 |
| 6,177,684 B1 | 1/2001 | Sugiyama | 257/17 |
| 6,191,436 B1 | 2/2001 | Shibata et al. | 257/91 |
| 6,242,328 B1 | 6/2001 | Shin | 438/518 |
| 6,261,862 B1 * | 7/2001 | Hori et al. | 438/96 |
| 6,277,665 B1 | 8/2001 | Ma et al. | |
| 6,355,945 B1 | 3/2002 | Kadota et al. | 257/82 |
| 6,423,984 B1 * | 7/2002 | Kato et al. | 257/103 |
| 6,429,102 B1 | 8/2002 | Tsai et al. | 438/508 |
| 6,455,337 B1 | 9/2002 | Sverdlov | 438/22 |
| 6,465,808 B2 | 10/2002 | Lin | 257/81 |
| 2002/0036286 A1 | 3/2002 | Ho et al. | 257/11 |
| 2002/0042159 A1 | 4/2002 | Chiyo et al. | 438/46 |
| 2002/0043890 A1 | 4/2002 | Lu et al. | 310/313 D |
| 2003/0178634 A1 * | 9/2003 | Koide | 257/103 |
| 2004/0026704 A1 | 2/2004 | Nikolaev et al. | |
| 2004/0051105 A1 | 3/2004 | Tsuda et al. | |

FOREIGN PATENT DOCUMENTS

| | | | |
|---|---|---|---|
| EP | 0 723 303 A3 | 5/1997 | H01L/33/00 |
| EP | 0 779 666 A2 | 6/1997 | H01L/33/00 |
| EP | 0 731 490 A3 | 3/1998 | H01L/21/033 |
| EP | 0 942 459 A1 | 9/1999 | |
| EP | 0 961 328 A2 | 12/1999 | H01L/33/00 |
| JP | 4-297023 | 10/1992 | H01L/21/205 |
| JP | 4-288871 | 8/1993 | H01L/21/469 |
| JP | 6-291366 | 10/1994 | H01L/33/00 |
| JP | 407263408 A | 10/1995 | H01L/21/3065 |
| JP | 9-17975 | 1/1997 | H01L/27/108 |
| JP | 9-227298 | 9/1997 | C30B/29/38 |
| JP | 10-22568 | 1/1998 | H01S/3/18 |
| JP | 10-163525 | 6/1998 | H01L/33/00 |
| JP | 10-312971 | 11/1998 | H01L/21/205 |
| JP | 10-321913 | 12/1998 | H01L/33/00 |
| JP | 11-111867 | 4/1999 | H01L/21/8247 |
| JP | 11-135832 | 5/1999 | H01L/33/00 |
| JP | 11-145057 | 5/1999 | H01L/21/20 |
| JP | 11-145516 | 5/1999 | H01L/33/00 |
| JP | 11-266004 | 9/1999 | H01L/29/06 |
| JP | 11-346032 | 12/1999 | H01S/3/18 |
| JP | 11-346035 | 12/1999 | H01S/3/18 |
| JP | 11-354839 | 12/1999 | H01L/33/00 |
| JP | 11-354840 | 12/1999 | H01L/33/00 |
| JP | 11-354842 | 12/1999 | H01L/33/00 |
| JP | 2000-21789 | 1/2000 | H01L/21/205 |
| JP | 2000-91252 | 3/2000 | H01L/21/205 |
| JP | 2000-91253 | 3/2000 | H01L/21/205 |
| JP | 2000-174344 | 6/2000 | H01L/33/00 |
| JP | 2000-357820 | 12/2000 | H01L/33/00 |
| WO | WO98/42030 | 9/1998 | H01L/33/00 |
| WO | WO98/44569 | 10/1998 | H01L/33/00 |

OTHER PUBLICATIONS

Patent Abstract of Japanese Patent No. JP11354840, published Dec. 24, 1999, 1 page.

Patent Abstract of Japanese Patent No. JP11354842, published Dec. 24, 1999, 1 page.

Patent Abstract of Japanese Patent No. JP11266004 corresponding to U.S. Patent No. 6,177,684, published Jan. 23, 2001, 1 page.

Patent Abstracts of Japan, Publication No. 09227298A, published Sep. 2, 1977, 1 page.

Patent Abstracts of Japan, Publication No. 10022568A, published Jan. 23, 1998, 1 page.

Patent Abstracts of Japan, Publication No. 11135832A, published May 21, 1999, 1 page.

Patent Abstracts of Japan, Publication No. 11145057A, published May 28, 1999, 1 page.

Patent Abstracts of Japan, Publication No. 11145516A, published May 28, 1999, 1 page.

Patent Abstracts of Japan, Publication No. 11346032A, published Dec. 14, 1999, 1 page.

Patent Abstracts of Japan, Publication No. 11346035A, published Dec. 14, 1999, 1 page.

Patent Abstracts of Japan, Publication No. 2000091252A, published Mar. 31, 2000, 1 page.

Patent Abstracts of Japan, Publication No. 2000091253A, published Mar. 31, 2000, 1 page.

Patent Abstracts of Japan, Publication No. 2000357820A, published Dec. 26, 2000, 1 page.

Patent Abstracts of Jaanese Patent No. JP4297023 corresponding to European Patent No. EP0497350, published Aug. 5, 1992, 1 page.

"InGaN/GaN/AlGaN–based laser diodes with modulation–doped strained–layer superlattices grown on an epitaxially laterally overgrown GaN substrate", Shuji Nakamura et al. Appl. Phys. Lett. 72 (2), Jan. 12, 1988, 1998 American Institute of Physics, 3 pages.

"Influence of sapphire nitridation on properties of gallium nitride grown by metalorganic chemical vapor deposition", S. Keller et al. Appl. Phys. Lett. 68 (11), Mar. 11, 1996, 1996 American Institute of Physics, 3 pages.

"The effect of the Si/N treatment of a nitridated sapphire surface on the growth mode of GaN in low–pressure metalorganic vapor phase epitaxy", S. Haffouz et al. Applied Physics Letters, vol. 73, No. 9, Aug. 31, 1998, 3 pages.

"Growth of high–quality GaN by low–pressure metal–organic vapour phase epitaxy (LP–MOVPE) from 3D islands and lateral overgroth", H. Lahreche et al. N.H Elsevier Journal of Crystal Growth 205 (1999) 245–252, 8 pages.

"Optimization of Si/N Treatment Time of Sapphire Surface and Its Effect on the MOVPE GaN Overlayers", S. Haffouz et al. phys. stat. sol. (a) 176, 677 (1999), 5 pages.

"Influence of in situ sapphire surface preparation and carrier gas on the growth mode of GaN in MOVPE" P. Venegues et al. N.H. Elsevier Journal of Crystal Growth 187 (1998) 167–177, 11 pages.

Excerpt from the Workbook of "The Tenth International Conference on Metalorganic Vapor Phase Epitaxy" Hokkaido University Jun. 5–9, 2000, 5 pages.

Patent Abstracts of Japan, Publication No. 07097300, Publication Date Apr. 11, 1995, 1 page.

Patent Abstracts of Japan, Publication No. 10178213, Publication Date Jun. 30, 1998, 1 page.

Patent Abstracts of Japan, Publication No. 10242061, Publication Date Sep. 11, 1998, 1 page.

Patent Abstracts of Japan, Publication No. 11186174, Publication Date Jul. 9, 1999, 1 page.

Patent Abstracts of Japan, Publication No. 11274557, Publication Date Oct. 8, 1999, 1 page.

Patent Abstracts of Japan, Publication No. 2000306854, Publication Date Nov. 2, 2000, 1 page.
European Search Report dated Nov. 11, 2002, 4 pages.
European Search Report dated Nov. 27, 2002, 4 pages.
European Search Report dated Jan. 8, 2003, 3 pages.
Patent Abstracts of Japan, Publication No. 11111867, Publication Date Apr. 23, 1999, 1 page.
S. Sakai et al., "A New Method of Reducing Dislocation Density in GaN Layer Grown on Sapphire Substrate by MOVPE", Journal of Crystal Growth 221 (2000) pp. 334–227.
European Search Report dated Nov. 27, 2002 (4pages).
Patent Abstracts of Japan, Publication No. 10242061, Publication Date Sep. 11, 1998, 1 page.
Patent Abstracts of Japan, Publication No. 11186174, Publication Date Jul. 9, 1999, 1 page.

Matthew Joseph et al., "P–Type Electrical Conduction in ZnO Thin Films by Ga and N Codoping", Jpn. J. Appl. Phys. vol. 38 (1999) pp. L1205–L1207.
Kikuo Tominaga, et al., "Preparation of Conductive ZnO: Al Films by a Facing Target System with a Strong Magnetic Field", Thin Solid Films 253 (1994), pp. 9–13.
Japanese Patent Application Ser. No. 091100294 Office Action dated Mar. 14, 2003.
Japanese Patent Application Ser. No. 2000–289103 Office Action Dated Apr. 22, 2003.
Japanese Patent Application Ser. No. 2000–358412 Office Action dated May 27, 2003.
U.S. Patent Appl. No. 10/139,863 Office Action dated May 23, 2003.

* cited by examiner

US 6,861,270 B2

METHOD FOR MANUFACTURING GALLIUM NITRIDE COMPOUND SEMICONDUCTOR AND LIGHT EMITTING ELEMENT

BACKGROUND OF THE INVENTION

1. Field of the Invention

The present invention relates to a method for manufacturing a gallium nitride compound semiconductor, and in particular to a light emitting element with improved light emitting efficiency and a method of realizing such.

2. Description of the Related Art

In recent years, AlGaN and AlGaN/GaN quantum well superlattices (MQW) or the like have come to be known as materials for light emitting elements, particularly as materials for elements emitting light in the ultraviolet band. Typically, these materials are formed on a sapphire substrate, and dislocations are present due to lattice mismatch of an order of 108~109/cm2.

At a dislocation, an electron and a hole, which are the carriers, recombine without emitting light (non-luminous recombination). Because of this, as the dislocation density increases, the light emitting efficiency of a light emitting element in general decreases.

FIG. 4 schematically shows the band gap Eg of a material for a light emitting element. As shown, when there is a spatial fluctuation in the band gap of the light emitting element material, light emission occurs only at the locations where the band gap is narrow (gap "a" in the figure). Therefore, if the density of the light emitting points based on the spatial fluctuation of the band gap can be set to exceed the density of dislocations in the light emitting element materials, it is possible to obtain a percentage of the luminous recombination occurring at the points where the band gap is narrow which is higher than the percentage of the non-luminous recombination of an electron and a hole at the dislocations (gap "b" in the figure), and, therefore, degradation in the light emitting efficiency can be inhibited.

SUMMARY OF THE INVENTION

One object of the present invention is to improve characteristics of a gallium nitride based semiconductor, such as, for example, light emitting efficiency, even when dislocations are present in the semiconductor.

In order to achieve this and other objects, there is provided, according to one aspect of the present invention, a method for manufacturing a gallium nitride based semiconductor, comprising the steps of (a) forming a first gallium nitride based semiconductor on a substrate; (b) forming of a composition material of the first gallium nitride based semiconductor a discrete area on the first gallium nitride based semiconductor; and (c) forming a second gallium nitride based semiconductor on the first gallium nitride based semiconductor onto which the composition material is formed. A spatial fluctuation is created in the band gap by producing a change in compositional ratio in the second gallium nitride based semiconductor by the composition material.

When the composition material is present, the solid phase composition of the composition material is increased in a gallium nitride based semiconductor when it is formed on the composition material. Because of this, the compositional ratio in the region where the composition material is present differs from that in the region where the composition material is not present. Due to the difference in the compositional ratio, a spatial fluctuation is produced in the band gap. By forming the spatial fluctuation in the band gap, recombination of the carriers are facilitated at the region where the band gap is narrow, and, thus, the light emitting efficiency can be increased even when such dislocations are present. It is preferable that the spatial fluctuation of the band gap be formed at a density higher than the dislocation density. For example, if the dislocation density is $10^8 \sim 10^9/cm^2$, it is preferable that the spatial fluctuation be formed so that the average distance at the region where the band gap is narrow (light emitting point) is 1 um or less. The period of the spatial fluctuation of the band gap can be adjusted by adjusting the density of the discretely formed composition material.

According to another aspect of the present invention, there is provided a method for manufacturing a gallium nitride based semiconductor comprising the steps of (a) forming, on a substrate, a base layer created by forming a discrete layer for varying diffusion length of the composition materials of a gallium nitride based semiconductor; and (b) forming the gallium nitride based semiconductor on the base layer. A variation in the compositional ratio is produced in the gallium nitride based semiconductor through the variation in the diffusion lengths of the composition materials, in order to create a spatial fluctuation in the band gap.

When there is a layer which varies the diffusion lengths of the composition materials and a gallium nitride based semiconductor is formed on this layer, compositional change occurs between the composition materials of the gallium nitride based semiconductor as a result of the variations in the diffusion lengths. Because of the compositional change, a spatial fluctuation is produced in the band gap. The period of the spatial fluctuation of the band gap can be adjusted by adjusting the density of the layer for changing the diffusion lengths of the composition materials.

According to still another aspect of the present invention, there is provided a method for manufacturing a gallium nitride based semiconductor comprising the steps of (a) forming, on a substrate, a base layer having a lattice mismatch; and (b) forming the gallium nitride based semiconductor on the base layer. A spatial fluctuation is created in the band gap of the gallium nitride based semiconductor by the lattice mismatch.

When there is a lattice mismatch, the thickness of the gallium nitride based semiconductor layer at the region where the lattice mismatch is present differs (namely, the thickness is narrower) from the thickness in the other regions. Due to this variation in the layer thickness, a spatial fluctuation of the band gap is produced. When the gallium nitride based semiconductor has a superlattice structure, the spatial fluctuation of the band gap becomes pronounced.

According to yet another aspect of the present invention, there is provided a light emitting element using a gallium nitride based semiconductor. The light emitting element comprises a substrate; a first gallium nitride based semiconductor layer formed on the substrate; a composition material of the first gallium nitride based semiconductor formed as a discrete area on the first gallium nitride based semiconductor layer; and a second gallium nitride based semiconductor layer having a compositional ratio variation and formed on the first gallium nitride based semiconductor layer on which the composition material is formed.

According to another aspect of the present invention, there is provided a light emitting element comprising a substrate; a base layer formed on the substrate and created by forming a discrete layer for varying the diffusion lengths of the composition materials of the gallium nitride based semiconductor; and a gallium nitride based semiconductor layer having compositional ratio variation formed on the base layer.

According to another aspect of the present invention, a light emitting element comprises a substrate; a base layer formed on the substrate and having a lattice mismatch; and a gallium nitride based semiconductor layer formed on the base layer and having a spatial fluctuation in the band gap.

The present invention should become more apparent by referring to the following detailed description of the embodiments.

BRIEF DESCRIPTION OF THE DRAWINGS

FIGS. 1A, 1B, and 1C are explanatory diagrams showing a method for manufacturing a gallium nitride based semiconductor according to a first embodiment of the present invention.

DESCRIPTION OF PREFERRED EMBODIMENTS

Figure 1A:
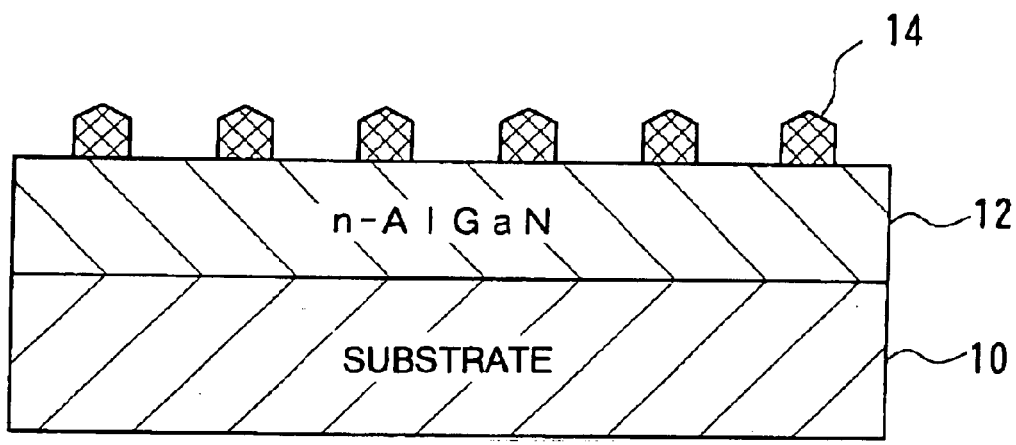

Preferred embodiments of the present invention will now be described referring to the drawings.

Figure 1B:
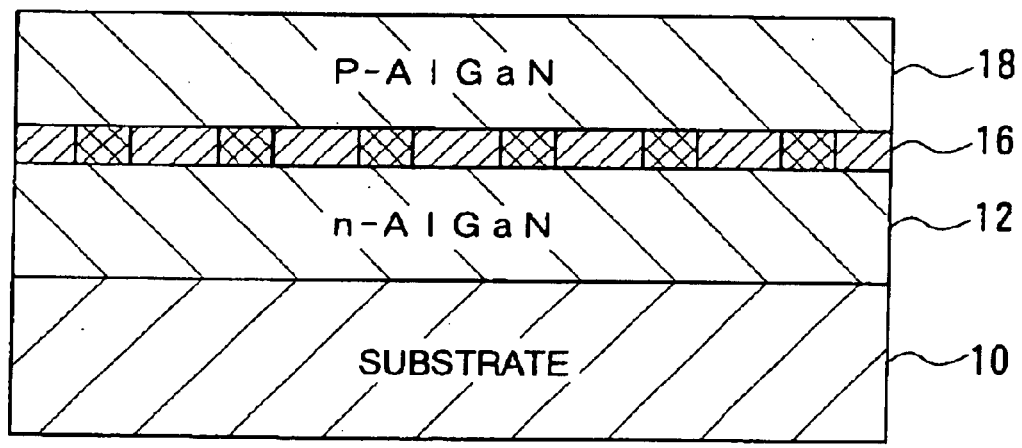

FIGS. 1A and 1B show a method for manufacturing a gallium nitride based semiconductor according to a first embodiment of the present invention. In the first embodiment, a light emitting element having a three-layer double hetero structure of n type $Al_yGa_{1-y}N$/undoped $Al_xGa_{1-x}N$/p type $Al_yGa_{1-y}N$ is manufactured.

First, as shown in FIG. 1A, an n type $Al_yGa_{1-y}N$ layer 12 is grown on a substrate 10 such as, for example, sapphire at a temperature of 1050° C. Then, trimethyl gallium and nitrogen gas are supplied to the substrate for few seconds at a temperature of 800~1050° C., to thereby form on the n type $Al_yGa_{1-y}N$ layer 12 using MOCVD discrete gallium droplets 14 having a diameter of approximately 10~500 nm.

Then, as shown in FIG. 1B, an undoped $Al_xGa_{1-x}N$ layer 16 is grown at a temperature of 1050° C. on the n type $Al_yGa_{1-y}N$ layer 12 onto which the Ga droplets (or microblocks of gallium) 14 are formed. Here, in the regions where Ga droplets are present, the solid phase composition of gallium within the undoped $Al_xGa_{1-x}N$ layer 16 becomes high, and thus, a spatial fluctuation is formed in the band gap of the undoped $Al_xGa_{1-x}N$ layer 16. In FIG. 1B, this phenomenon of compositional variation within the undoped $Al_xGa_{1-x}N$ layer 16 due to the gallium droplets 14 is schematically shown by different hatchings. The undoped $Al_xGa_{1-x}N$ layer 16 can have, for example, a thickness of 0.05 μm. Such compositional variation produces a spatial fluctuation in the band gap, that is, widening and narrowing of the band gap. After the undoped $Al_xGa_{1-x}N$ layer 16 in which the spatial fluctuation is produced in the bad gap is grown, a p type $Al_yGa_{1-y}N$ layer 18 is grown at a temperature of 1050° C. to produce a double hetero structure. These growth of semiconductor layers can be performed by mounting the substrate on a susceptor of a reaction tube and sequentially introducing the material gas into the reaction tube while heating the substrate 10 with a heater.

The present inventors have confirmed that when a voltage is applied to a double hetero type light emitting element obtained as described above so that light is emitted, the illumination intensity is approximately 10 times the illumination intensity for a structure grown without forming the Ga droplets 14.

In the above example of the first embodiment, Ga is used as the material for the droplets 14, but the first embodiment is not limited to such a structure, and either Al or Ga, which are both composition materials of the AlGaN, can be used. For example, droplets of Al can be formed by flowing trimethyl aluminum onto n-AlGaN 12 in place of the trimethyl gallium.

Figure 2A:
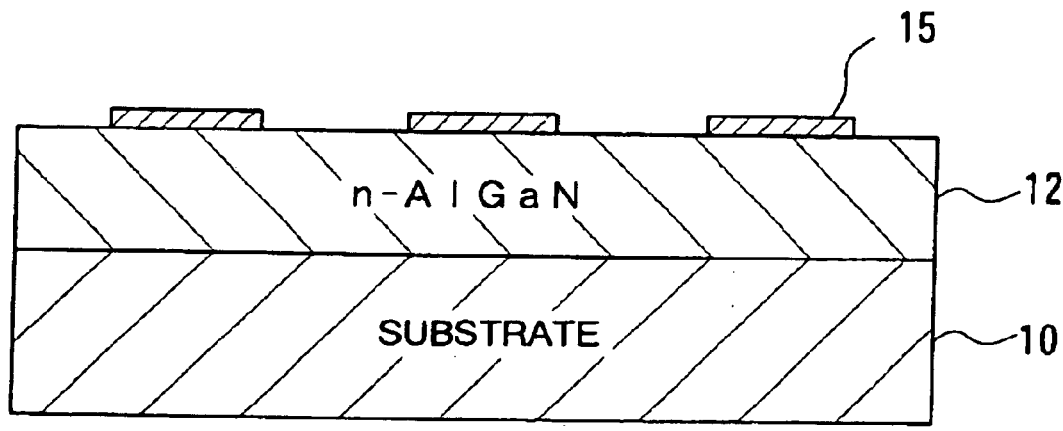
FIGS. 2A and 2B are explanatory diagrams showing a method for manufacturing a gallium nitride based semiconductor according to a second embodiment of the present invention.
Figure 2B:
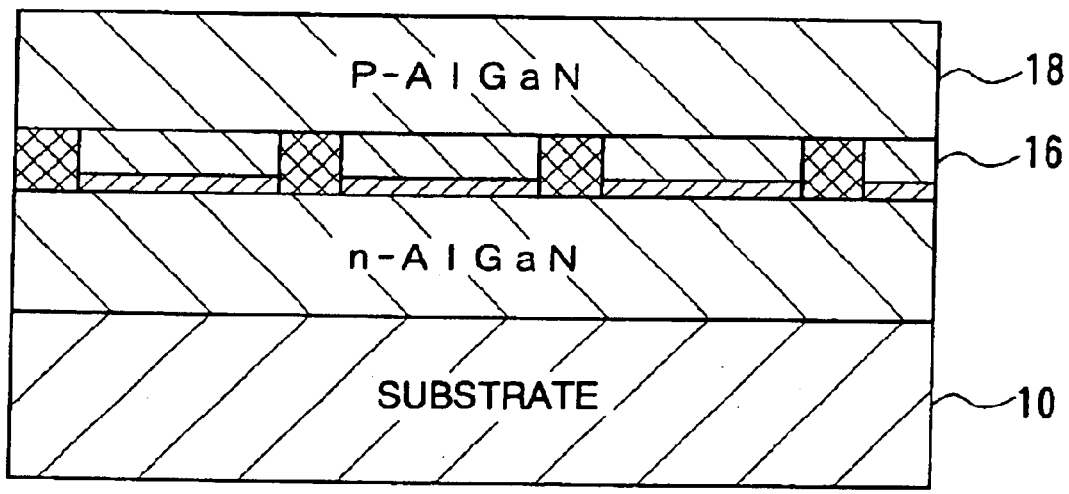

FIGS. 2A and 2B show a method for manufacturing a gallium nitride based semiconductor according to a second embodiment. In the second embodiment, a light emitting element having a three-layer double hetero structure of AlGaN is manufactured, similar to FIGS. 1A and 1B.

First, as shown in FIG. 2A, an n type $Al_yGa_{1-y}N$ layer 12 is grown on a substrate 10 at a temperature of 1050° C., and a discrete SiN layer 15 is formed on the surface of the n type $Al_yGa_{1-y}N$ layer 12. In order to form a discrete SiN layer 15, the SiN layer can be formed first on the entire surface and then a portion of the SiN layer can be removed, or by adjusting the amount of flow of silane gas and ammonia gas, which are material gases for SiN. The region where the SiN layer 15 is formed becomes a mask section and the region where the SiN layer 15 is not formed becomes a window section.

Next, as shown in FIG. 2B, a undoped AlGaN layer 16 is grown on the n type $Al_yGa_{1-y}N$ layer 12 onto which the SiN layer 15 is formed. Here, the growth begins at the window section where the SiN layer 15 is not formed and progresses onto the SiN layer 15. When the undoped AlGaN layer 16 is grown on the SiN layer 15, the compositions of Al and Ga within the undoped $Al_xGa_{1-x}N$ layer 16 differ between the window and mask sections because the diffusion lengths of the Ga atom and Al atom on SiN are different. More specifically, because Al is absorbed by solids and does not migrate in SiN as much as does Ga, and, the Al composition at the window section is relatively small. As the Al composition decreases, the band gap becomes narrower (smaller), with a result that a spatial fluctuation is generated in the band gap of the undoped $Al_xGa_{1-x}N$ layer 16. After the undoped $Al_xGa_{1-x}N$ layer 16 in which a spatial fluctuation is formed in the band gap is grown, a p type $Al_yGa_{1-y}N$ layer 18 is grown, to obtain a double hetero structure.

With the second embodiment, as with the first embodiment, a spatial fluctuation in the band gap can easily be created with a density greater than or equal to the dislocation density, and, thus, the light emitting efficiency can be improved.

Figure 3:
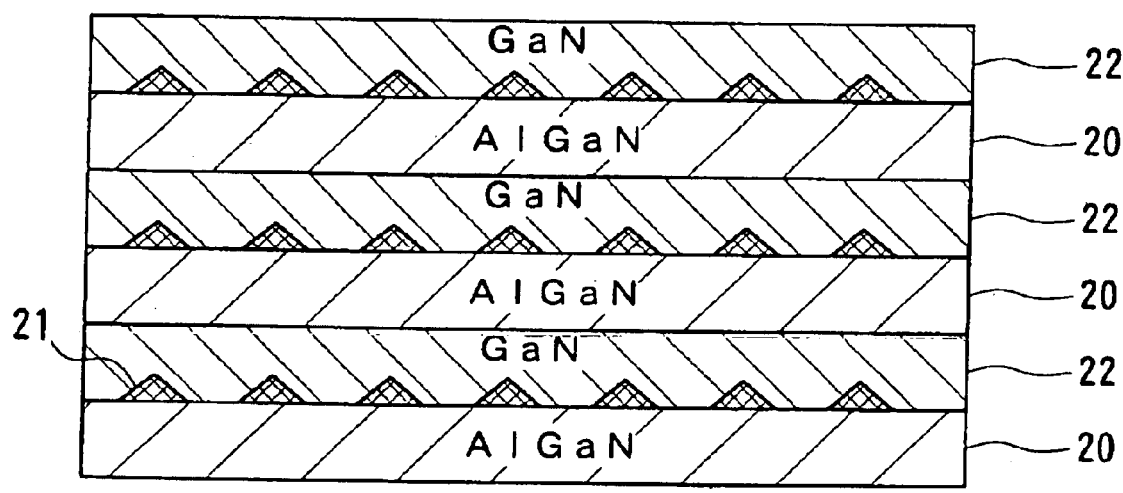
FIGS. 3A and 3B are explanatory diagrams showing a method for manufacturing a gallium nitride based semiconductor according to a third embodiment of the present invention.
Figure 4:
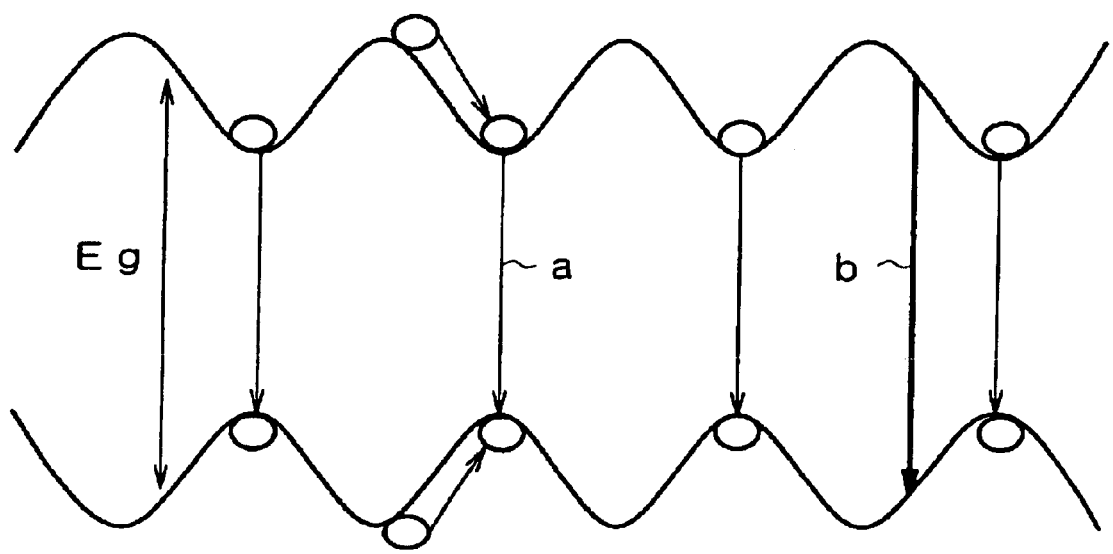
FIG. 4 is an explanatory diagram illustrating spatial fluctuation in a band gap.

FIG. 3 shows a method for manufacturing a gallium nitride based semiconductor according to a third embodiment of the present invention. In the third embodiment, a light emitting element is manufactured having a AlGaN/GaN quantum well superlattice structure.

An AlGaN layer 20 is formed on a substrate (not shown) and then a GaN layer 22 is formed. These layers are formed in a similar manner in a repetition of n pitches (n can be set, for example, as 20) to obtain a superlattice structure. The thickness of each layer can be set at 1~100 nm, for example, 5 nm. When forming the GaN layer 22 on the AlGaN layer 20, a discrete layer (lattice mismatch layer) 21 of a material having relatively high lattice mismatch, more specifically, AlN, InN, AlInGaN, Si, MgN, or the like is formed, and the GaN layer 22 is formed on the AlGaN layer 20 onto which this layer 21 is formed. Each of the layers including the layer 21 can be formed by MOCVD, as with the above two embodiments. When there is a substance having a large lattice mismatch at the interface of a superlattice, minute unevenness is generated on the surface. Because the thickness of the GaN layer 22 in the portion of the unevenness differs from that of the other portions, the thickness of the layer becomes non-uniform. Due to this non-uniformity, the quantum level based on the quantum effect spatially varies and the band gap is spatially fluctuated. By forming the layer 21 with a density sufficient to set the density of the spatial fluctuation of the band gap to greater than or equal to the dislocation density, the light emitting efficiency can be improved.

The present inventors have confirmed that when a voltage is applied to a light emitting element having a superlattice structure as shown in FIG. 3 (using AlN as the layer 21), a light emission intensity of 10 times that produced when the layer 21 is not formed can be achieved.

While illustrative embodiments of the present invention have been described, the present invention is not limited to these embodiments, and various modifications can be made within the scope of the invention. For example, in FIGS. 2A and 2B, a material other than SiN, for example, $SiO_2$, can be used as the layer for varying the diffusion lengths for the composition materials of AlGaN.

Also, although FIG. 3 shows a lattice mismatch layer 21 formed on the AlGaN layer 20, it is also possible to form the lattice mismatch layer 21 on the GaN layer 22 and form a spatial fluctuation in the band gap of the AlGaN layer 20.

Furthermore, although FIG. 3 shows an example employing an AlGaN/GaN MQW structure, the MQW can be constructed from other materials. For example, the MQW structure may be preferably formed from AlGaN/AlN/GaN. In such a case, the lattice mismatch layer 21 can be formed at the interface between AlGaN and AlN and the interface between AlN and GaN.

What is claimed is:

1. A method for manufacturing a gallium nitride based semiconductor, comprising the steps of:
   (a) forming a first gallium nitride based semiconductor on a substrate, the first gallium nitride based semiconductor having a first surface;
   (b) forming on less than a total area of the first surface a composition material of the first gallium nitride based semiconductor; and
   (c) forming a second gallium nitride based semiconductor on the first gallium nitride based semiconductor on which the composition material is formed; wherein a spatial fluctuation is created in the band gap by variation in the compositional ratio in the second gallium nitride based semiconductor created by the composition material, and the second gallium nitride based semiconductor is a light emitting layer.

2. A method according to claim 1, wherein the first gallium nitride based semiconductor and the second gallium nitride based semiconductor are AlGaN; and the composition material is one selected from Ga and Al.

3. A method for manufacturing a gallium nitride based semiconductor, comprising the steps of:
   (a) forming a base layer on a substrate, the base layer constructed by forming a layer on less than a total area of a surface of the base layer for varying the diffusion lengths of composition materials of a gallium nitride based semiconductor; and
   (b) forming the gallium nitride based semiconductor on the base layer; wherein
   a spatial fluctuation is created in the band gap by creating a variation in the compositional ratio in the gallium nitride based semiconductor by varying the diffusion lengths of the composition materials, and the gallium nitride based semiconductor is a light emitting layer.

4. A method according to claim 3, wherein the gallium nitride based semiconductor is AlGaN and the layer for varying the diffusion lengths of the composition materials is formed from SiN.

5. A method for manufacturing a gallium nitride based semiconductor comprising the steps of:
   (a) forming, on a substrate, a base layer having a lattice mismatch layer formed on less than a total area of a surface of the base layer; and
   (b) forming the gallium nitride based semiconductor on the base layer; wherein
   a spatial fluctuation is created in the band gap of the gallium nitride based semiconductor by the lattice mismatch, and the gallium nitride based semiconductor is a light emitting layer.

6. A method according to claim 5, wherein the lattice mismatch is formed by discretely forming at least one of AlN, InN, AlInGaN, Si, AlGaN, and MgN.

7. A method according to claim 5, wherein the gallium nitride based semiconductor has a superlattice structure of AlGaN and GaN.

8. A light emitting element comprising a gallium nitride based semiconductor, the light emitting element comprising:
   a substrate;
   a first gallium nitride based semiconductor layer formed on the substrate, the first gallium nitride based semiconductor layer having a first surface;
   a composition material of the first gallium nitride based semiconductor formed on less than a total area of the first surface; and
   a second gallium nitride based semiconductor layer having a varied compositional ratio and formed on the first gallium nitride based semiconductor layer onto which the composition material is formed, and the second gallium nitride based semiconductor is a light emitting layer.

9. A light emitting element according to claim 8, wherein the first gallium nitride based semiconductor and the second gallium nitride based semiconductor are AlGaN; and the composition is one selected from Ga and Al.

10. A light emitting element comprising a gallium nitride based semiconductor, the light emitting element comprising:
    a substrate;
    a base layer formed on the substrate and constructed by forming a layer on less than a total area of a surface of the base layer for varying the diffusion lengths of the composition materials of the gallium nitride based semiconductor; and
    gallium nitride based semiconductor layer having a varied compositional ratio and formed on the base layer, and the gallium nitride based semiconductor is a light emitting layer.

11. A light emitting element according to claim 10, wherein the layer for changing the diffusion length of the composition materials is SiN and the gallium nitride based semiconductor is AlGaN.

12. A light emitting element using a gallium nitride based semiconductor, the light emitting element comprising:
    a substrate;
    a base layer formed on the substrate and having a lattice mismatch formed on less than a total area of a surface of the base layer; and
    a gallium nitride based semiconductor layer formed on the base layer and having a spatial fluctuation in the band gap, and the gallium nitride based semiconductor is a light emitting layer.

13. A light emitting element according to claim 12, wherein the gallium nitride based semiconductor layer has a superlattice structure.

* * * * *